United States Patent
Miyazaki

(10) Patent No.: US 11,340,267 B2
(45) Date of Patent: May 24, 2022

(54) CURRENT DETECTION DEVICE HAVING A CURRENT TRANSFORMER WITH A COMMON COIL SECTION

(71) Applicant: SUMIDA CORPORATION, Tokyo (JP)

(72) Inventor: Hiroyuki Miyazaki, Natori (JP)

(73) Assignee: SUMIDA CORPORATION

( * ) Notice: Subject to any disclaimer, the term of this patent is extended or adjusted under 35 U.S.C. 154(b) by 0 days.

(21) Appl. No.: 16/926,826

(22) Filed: Jul. 13, 2020

(65) Prior Publication Data

US 2021/0018539 A1    Jan. 21, 2021

(30) Foreign Application Priority Data

Jul. 19, 2019 (JP) .............................. JP2019-133552

(51) Int. Cl.
   *G01R 15/18*    (2006.01)
   *H01F 27/24*    (2006.01)
   *H01F 27/28*    (2006.01)
   *H01F 38/30*    (2006.01)

(52) U.S. Cl.
   CPC ........... *G01R 15/183* (2013.01); *H01F 38/30* (2013.01); *H01F 27/24* (2013.01); *H01F 27/28* (2013.01)

(58) Field of Classification Search
   None
   See application file for complete search history.

(56) References Cited

U.S. PATENT DOCUMENTS

| 4,542,440 A | 9/1985 | Chetty et al. |
| 5,315,498 A * | 5/1994 | Berrios .............. H02M 7/53871 363/98 |
| 2020/0358317 A1 * | 11/2020 | Richter .................. H01F 27/28 |

FOREIGN PATENT DOCUMENTS

| EP | 0631145 A2 | 12/1994 |
| JP | 2010-041814 A | 2/2010 |

OTHER PUBLICATIONS

Extended European Search Report for corresponding Application No. EP 20183678.0 dated Nov. 26, 2020 (8 pages).
European Office Action issued for the corresponding European Patent Application No. 20183678.0; dated Mar. 14, 2022 (total 5 pages).

* cited by examiner

*Primary Examiner* — Douglas X Rodriguez
(74) *Attorney, Agent, or Firm* — Harness, Dickey & Pierce, P.L.C.

(57) ABSTRACT

A current detection device is configured by a current path through which a first current flows, a current path through which a second current flows, a switching element that switches the current paths and allows the first current and the second current to flow alternately, a common coil section through which an induction current flows by the first current and the second current, and a turn current path that alternates a first induction current flowing through the coil section by the first current and a second induction current flowing through the coil section by the second current.

8 Claims, 7 Drawing Sheets

CURRENT DETECTION DEVICE HAVING A CURRENT TRANSFORMER WITH A COMMON COIL SECTION

CROSS-REFERENCE TO RELATED APPLICATIONS

This application claims the benefit of Japanese Patent Application No. 2019-133552 filed on Jul. 19, 2019, the disclosure of which is hereby incorporated by reference herein in its entirety.

BACKGROUND

Technical Field

The present invention relates to a current detection device.

Related Art

From a viewpoint of power saving, various devices are provided with a power monitoring system. Examples of a power monitoring system that measures a current include a device called a current transformer (CT). A current transformer is a device that converts an AC current to be measured into a secondary current in accordance with a winding ratio of a coil. Such a current transformer is disclosed in, for example, Japanese Laid-open patent publication No. 2010-41814. The power supply device disclosed in Japanese Laid-open patent publication No. 2010-41814 includes two primary windings connected in parallel to each other, and controls a current flowing through the two primary windings by a drive switch. The current flowing through the primary windings is detected using two current transformers.

The power supply device disclosed in Japanese Laid-open patent publication No. 2010-41814 detects a current using a plurality of current transformers, and controls a drive switch using the current. However, when a plurality of current transformers for current detection are arranged, and a current flowing through an arm of a full-bridge circuit is inserted through each of the current transformers, a space for installing the current transformers in the device is increased, which makes the device larger and makes a length of a routed wiring longer. The length of the wiring is a factor that contributes to surge noise and circuit driving stability, and is desirably short from a viewpoint of reducing surge noise and circuit driving stability.

The present invention has been made in view of the above, and relates to a current detection device advantageous for downsizing and capable of reducing a length of a routed wiring.

SUMMARY

According to the present invention, there is provided a current detection device comprising: a first current path through which a first current flows and a second current path through which a second current flows; a switching element that switches between the first current path and the second current path and allows the first current and the second current to flow alternately; a common coil section through which an induction current flows by the first current and the second current; and a current alternation unit that alternates the induction current flowing through the coil section by the first current and the induction current flowing through the coil section by the second current.

The present invention can provide a current detection device that is advantageous for downsizing and has a reduced length of routed wiring.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Hereinafter, a first embodiment and a second embodiment of the present invention will be described. Both the first embodiment and the second embodiment show a technical idea and a configuration example of the present invention, and do not limit a specific configuration or a dimension and shape. Further, the drawings used in the first embodiment and the second embodiment mainly show the functions, arrangements, relationships among the members, and the like, and do not accurately show the dimensions, shape, aspect ratio, and the like.

First Embodiment

Figure 1:
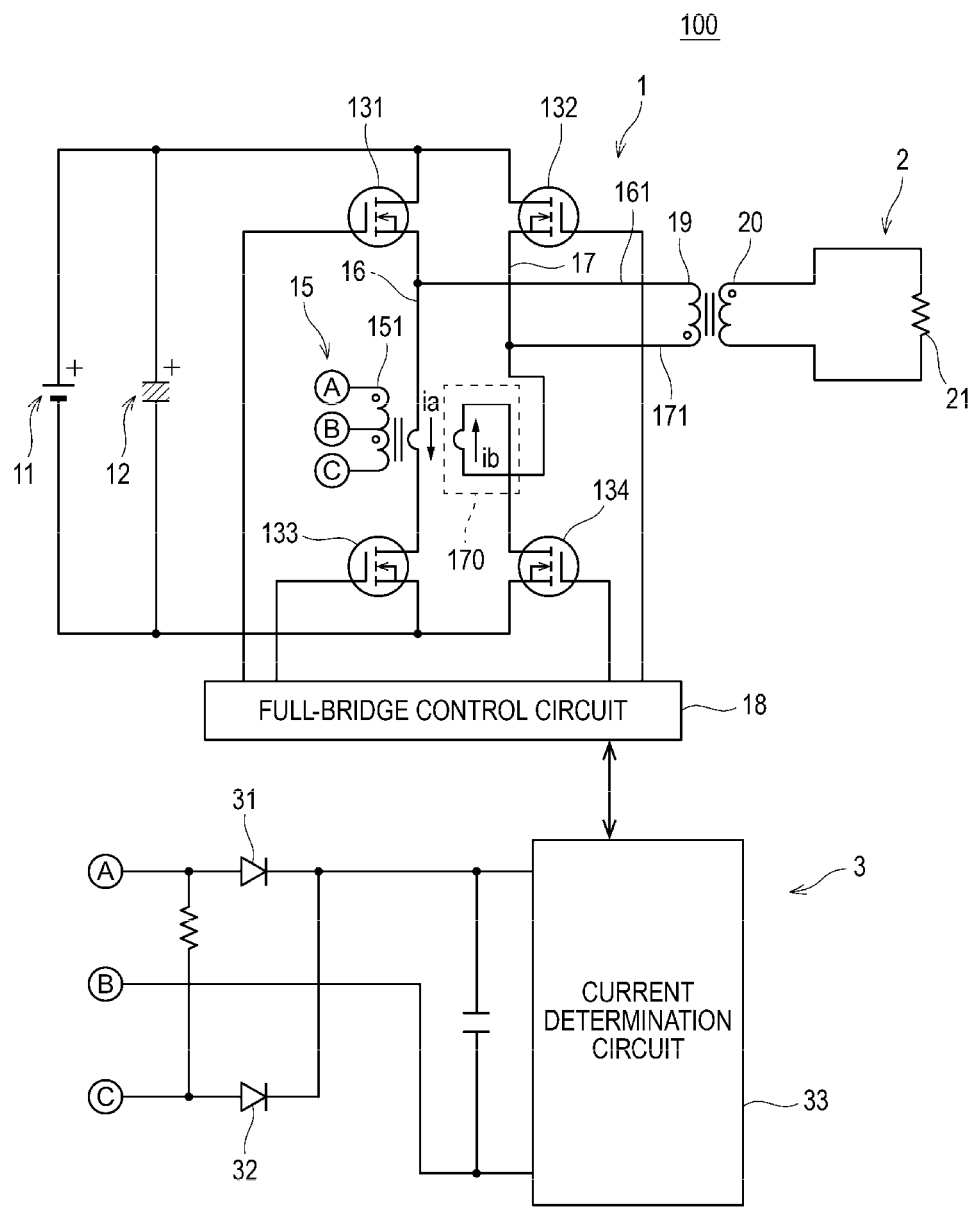
FIG. 1 is a diagram illustrating a current measurement system including a current detection device according to a first embodiment of the present invention.

FIG. 1 is a diagram for explaining a current measurement system 100 including a current detection device 1 according to the first embodiment. The current measurement system 100 includes a current detection device 1, a power feed unit 2 including a load 21 that receives power supply from a DC power supply 11, and a current determination unit 3 that rectifies a current detected by the current detection device 1 and determines a value of the current. The current determination unit 3 determines the value of the current detected by the current detection device 1, and controls a switching element of the current detection device 1. The current determination unit 3 may stop or start driving the current detection device 1 in accordance with a result of the determination.

Current Detection Device

The current detection device 1 includes a current path 16 as a first current path through which the first current ia flows, and a current path 17 as a second current path through which a second current ib flows. The current detection device 1 further includes switching elements 131, 132, 133, and 134 that switch between the current path 16 and the current path 17 and allow the first current ia and the second current ib to flow alternately, and a common coil section 151 through which an induction current flows by the first current ia and the second current ib. The coil section 151 is a coil part of a current transformer 15, and a detection signal is output from output terminals A and C of the coil section 151 by induced electromotive force generated in the coil section 151.

The switching elements 132 and 133 configure a first transistor pair including two transistor elements that allow the first current ia to flow through the current path 16. The switching elements 131 and 134 configure a second transistor pair including two transistor elements that allow the second current ib to flow through the current path 17. The switching elements 131 to 134 configure a full-bridge circuit, and the current paths 16 and 17 each become an arm of the full-bridge circuit. The first current ia flowing through the current path 16 and the second current ib flowing through the current path 17 are arm currents of the full-bridge circuit.

In such a full-bridge circuit, for example, the switching elements 132 and 133 are turned on at the same time while the switching elements 131 and 134 are turned off. Meanwhile, a flow path of a current (current path) from the switching element 132 to a coil end 171, a coil 19, a coil end 161, and the switching element 133 is formed in the current detection device 1. A part of this current path between the switching elements 132 and 133 is defined as the current path 16. In this state, the current flowing out of the current detection device 1 flows between a source and a drain of the switching element 132 and flows into the current path 17. The current flowing into the current path 17 becomes the first current ia from the coil end 171 through the coil 19, and returns to the current detection device 1 through the source and the drain of the switching element 133.

Next, in the first embodiment, the switching elements 131 and 134 are turned on at the same time while the switching elements 132 and 133 are turned off. Meanwhile, a current path from the switching element 131 to the coil end 161, the coil 19, the coil end 171, and the switching element 134 is formed in the current detection device 1. A part of this current path between the switching elements 131 and 134 is defined as the current path 17. In this state, the current flowing out of the current detection device 1 flows between a source and a drain of the switching element 131, and further flows from the coil 19 to a turn current path 170 through the coil end 171. The current flowing into the turn current path 170 becomes the second current ib and returns to the DC power supply 11 through the source and the drain of the switching element 134.

The coil section 151 generates an induction current by a current flowing between the two switching elements 132 and 133 or between the two switching elements 131 and 134.

The current detection device 1 further includes the DC power supply 11 and a full-bridge control circuit 18 that controls the switching elements 131 to 134 by applying a voltage to gates of the switching elements 131 to 134. The full-bridge control circuit 18 controls the switching elements 132 and 133 to be turned on at the same time, and controls the switching elements 131 and 134 to be turned off during this time. Meanwhile, a current path from the DC power supply 11 to a current path 16 and from the switching element 133 on the current path 16 back to the DC power supply 11 are formed in the current detection device 1 as described above.

The full-bridge control circuit 18 controls the switching elements 131 and 134 to be turned on at the same time, and controls the switching elements 132 and 133 to be turned off during this time. Meanwhile, a current path from the DC power supply 11 to a current path 17 and from the switching element 134 on the current path 17 back to the DC power supply 11 are formed in the current detection device 1 as described above.

This full-bridge control circuit 18 may use a small computer such as a microcomputer.

In the first embodiment, the coil section 151 includes an output terminal B in addition to the output terminals A and C, which are a total of three output terminals A, B, and C. The output terminal B among these output terminals is a center tap that is drawn out of the coil section 151 in a middle of the coil section 151. When the center tap is provided in the coil section 151, the coil section 151 operates like two half-wave circuits, and the current flowing through the coil section 151 is full-wave rectified. In the first embodiment, this full-wave rectification allows the first current ia and the second current ib to be detected at the respective positive-side peak values, and allows both the first current ia and the second current ib to be determined at one determination reference value in a current determination circuit.

Figure 3:
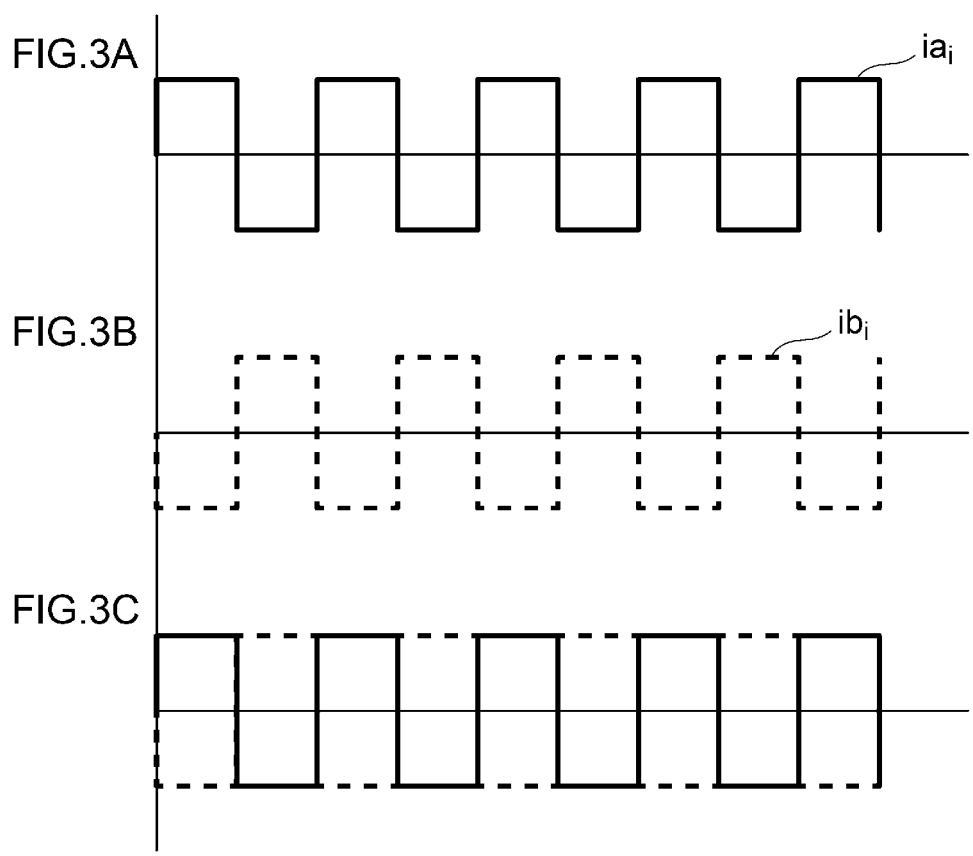
FIG. 3A is a schematic diagram illustrating a first induction current.
FIG. 3B is a schematic diagram illustrating a second induction current.
FIG. 3C is a schematic diagram illustrating a composite of the first induction current and the second induction current.

The first embodiment further includes a current alternation unit that alternates the induction current flowing through the coil section 151 by the first current ia and the induction current flowing through the coil section 151 by the second current ib. Here, "alternating the induction current" means flowing the induction current generated in the coil section 151 by the induced electromotive force such that flow directions are reversed at a constant cycle. The induction current flows to the coil section 151 when the first current ia and the second current ib which are DC currents flow or disappear (hereinafter, referred to as "turn-on or turn-off of the first current ia and turn-on or turn-off of the second current ib"). Such an induction current is represented by a waveform having a cycle corresponding to the turn-on or turn-off of the first current ia and the second current ib. In the first embodiment, since the flow directions of the first current ia and the second current ib are reversed, a phase of a first induction current $ia_i$ flowing through the coil section 151 by the first current ia and a phase of a second induction current $ib_i$ flowing through the coil section 151 by the second current ib are inverted (FIG. 3).

As shown in FIG. 1, the current detection device 1 according to the first embodiment includes the turn current path 170 in which the second current ib flows in the current path 17 in a direction opposite to the flow direction of the first current ia. An induction current is generated in the coil section 151 by the current flowing through the turn current path 170. As described above, the first induction current $ia_i$ and the second induction current $ib_i$ alternate with each other by reversing the flow directions of the first current ia and the second current ib. The turn current path 170 thus functions as a current alternation unit in the first embodiment. In other words, in the first embodiment, an AC current is generated from the first current ia and the second current ib which are DC currents by alternately turning on and off the switching elements 132 and 133 and the switching elements 131 and 134.

Figure 2:
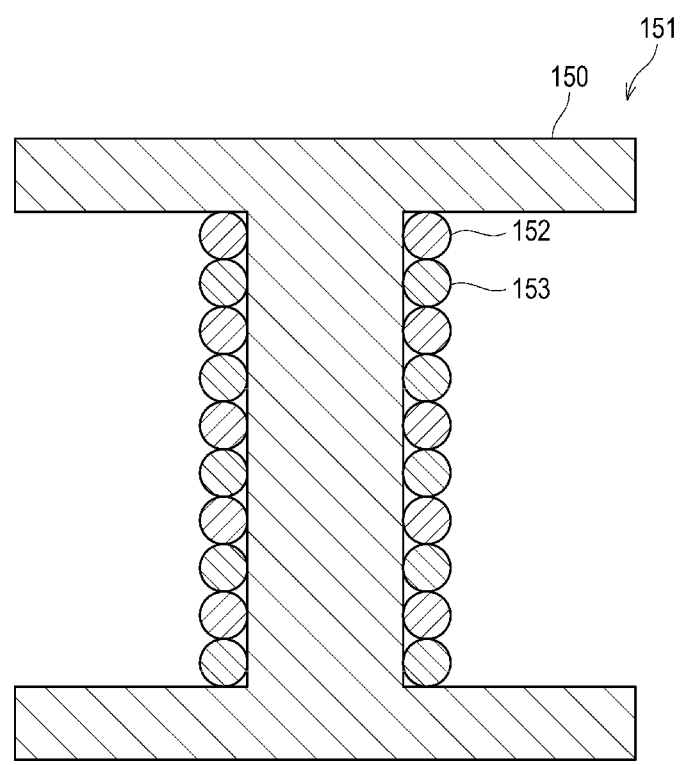
FIG. 2 is a schematic longitudinal sectional view of a coil section shown in FIG. 1.

FIG. 2 is a schematic diagram for explaining the coil section 151, and illustrates a longitudinal section of the coil section 151 only on a secondary side. The coil section 151 shown in FIG. 2 uses a core 150 having a middle leg. Examples of such a core are cores having an EI shape and an ER shape. The coil section 151 includes a core 150 such as an iron core, and a first coil 152 and a second coil 153 wound around the core 150. The first coil 152 and the second coil 153 are bifilar-wound around one core 150. In FIG. 2, the first coil 152 and the second coil 153 are distinguished from each other by inclinations of the hatching lines in the section.

Bifilar-winding refers to winding two conductive wires side by side in a length direction of the core 150 as shown in FIG. 2. In the bifilar-winding, the two conductive wires may be twisted and then wound.

The bifilar-wound coil section 151 has good coupling between the coils, reduced leakage inductance, and a low operating impedance. This coil section 151 has a configuration suitable for the current transformer 15 that measures the current flowing alternately through the two current paths 16 and 17.

Power Feed Unit

The power feed unit 2 includes a coil 19 having one coil end 161 connected to the current path 16 and the other coil end 171 connected to the current path 17, and a coil 20 separated from the coil 19. The coil 19 and the coil 20 configure an insulating transformer, and an induced electromotive force is generated in the coil 19 by the first current ia or the second current ib flowing through the coil 19. The induced electromotive force generated in the coil 19 is supplied to the load 21. When the current measurement system 100 is applied to, for example, an in-vehicle device, the load 21 may be a cell motor, an air conditioner, a car navigation device, or the like.

Current Determination Unit

The current determination unit 3 is connected to the output terminals A, B, and C of the coil section 151. Further, the current determination unit 3 includes a current determination circuit 33 that determines the current supplied to the power feed unit 2 by the first induction current $ia_i$ and the second induction current $ib_i$ input from the output terminals A and C. A diode 31 is provided between the output terminal A and the current determination circuit 33, and a diode 32 is provided between the output terminal C and the current determination circuit 33. Each of the diodes 31 and 32 allows a current to flow in a direction toward the current determination circuit 33. The first induction current $ia_i$ output from the output terminal A and the second induction current $ib_i$ output from the output terminal C are combined and input to the current determination circuit 33.

FIG. 3A is a schematic diagram illustrating the first induction current $ia_i$. FIG. 3B is a schematic diagram illustrating the second induction current $ib_i$. As shown in FIGS. 3A and 3B, the first induction current $ia_i$ and the second induction current $ib_i$ have waveforms whose phases are opposite to each other and are equal in amplitude with respect to a potential of the output terminal B. FIG. 3C is a diagram showing a composite waveform of the first induction current $ia_i$ and the second induction current $ib_i$.

The current determination circuit 33 detects a value of the current output in a positive direction of the composite waveform (hereinafter also referred to as "high current side") shown in FIG. 3C. Then, the detected value is output to the full-bridge control circuit 18. The full-bridge control circuit 18 may turn on and turn off the switching elements 132 and 133 and the switching elements 131 and 134 on the basis of, for example, timing of inputting a signal representing the detected value. Further, the full-bridge control circuit 18 may determine the values of the first current ia and the second current ib from the detected value on the high current side, and may determine an amount and abnormality of a supply current. At this time, the full-bridge control circuit 18 may turn off all of the switching elements 131 to 134 to stop the supply of the first current ia and the second current ib to the load 21.

The values of the first current ia and the second current ib can be determined, for example, by associating the values of the first current ia and the second current ib in advance with the values of the first induction current $ia_i$ and the second induction current $ib_i$ generated by the first current ia and the second current ib, respectively. The current determination circuit 33 may store in advance the values of the first induction current $ia_i$ and the second induced current $ib_i$ corresponding to the threshold values of the first current ia and the second current ib determined to be abnormal, and the switching elements 131 to 134 may be turned off when the values of the first induction current $ia_i$ and the second induction current $ib_i$ are above or below the threshold values.

Further, the current determination circuit 33 may output the detected value to the outside, and an external calculation device (not shown in the drawings) may calculate the detected value on the high current side, the current supplied to the coil 19, and the power supplied to the load 21. The detected value detected by the current determination circuit 33 is used for, for example, constant current control or over current protection (OCP) control of the current detection device 1.

Next, the overall operation of the current measurement system 100 will be described. In the current detection device 1, first, the full-bridge control circuit 18 turns on the switching elements 132 and 133 and turns off the switching elements 131 and 134. At this time, the current flowing from the DC power supply 11 passes through the current path 16 as the first current ia, and induces the first induction current $ia_i$ in the coil section 151.

Next, the full-bridge control circuit 18 turns on the switching elements 131 and 134 and turns off the switching elements 132 and 133. The current flowing out of the DC power supply 11 passes through the current path 17 as the second current ib having an opposite flow direction, and induces the second induction current $ib_i$ in the coil section 151. As a result, the first induction current $ia_i$ and the second induction current $ib_i$ are output from the output terminal A or the output terminal C.

The first induction current $ia_i$ and the second induction current $ib_i$ that have been output are merged and input to the current determination circuit 33. In the first embodiment, the phases of the first induction current $ia_i$ flowing through the current path 16 and the second induction current $ib_i$ flowing through the current path 17 can be reversed by inverting one of the currents flowing through the current paths 16 and 17 with respect to the other current. Then, the values of the first induction current ia$_i$ and the second induction current ib$_i$ on the high current side can be detected from the waveform obtained by combining the first induction current ia$_i$ and the second induction current ib$_i$.

According to the first embodiment, both the first current ia and the second current ib can be measured by the common current transformer 15. This configuration can reduce the number of current transformers as compared with the configuration of Japanese Laid-open patent publication No. 2010-41814 in which the first current ia and the second current ib are measured by different current transformers. The current transformer, which includes a coil, has a relatively large installation space, and reducing the number of current transformers is advantageous for downsizing the entire device.

A compact device can shorten a length of the wiring routed in the device. In the first embodiment, the wiring is thus hardly affected by a surge current or noise, thereby enhancing the signal quality and the driving reliability.

In the first embodiment, the current on the primary side is doubled compared to a configuration in which the first current ia and the second current ib are measured by different current transformers. However, the first embodiment allows use of the coil section 151 having the same core size and the same number of windings as in the case where two current transformers are used for the current transformer 15 by alternating the first current ia and the second current ib.

Further, in the first embodiment, the bifilar-winding of the coil section 151 of one current transformer 15 allows a favorable detection of the current flowing through the two current paths 16 and 17 with one coil and the same level of measurement accuracy as in the configuration where the currents are measured by different current transformers. In the current measurement system 100 including one current transformer 15, only one current determination circuit 33 is sufficient, which is more advantageous for downsizing the device.

Second Embodiment

Next, a second embodiment of the present invention will be described.

Figure 4:
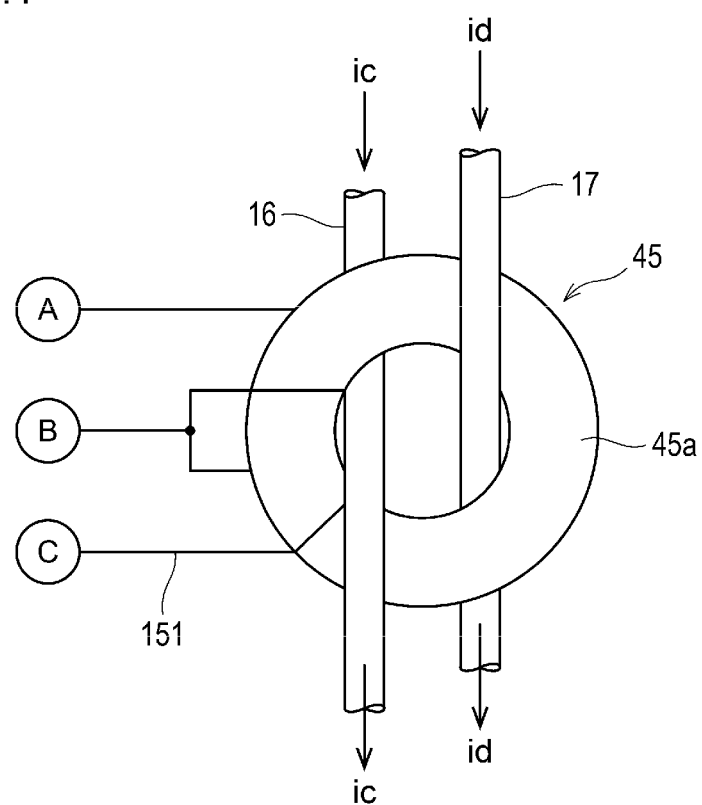
FIG. 4 is a diagram for explaining a second embodiment of the present invention, and is a schematic diagram illustrating an upper surface of a toroidal coil.

FIG. 4 is a diagram for explaining the second embodiment, and is a schematic diagram illustrating an upper surface 45a of a toroidal coil 45. The second embodiment is different from the first embodiment using a core 150 having the middle leg in that the coil section 151 is the toroidal coil 45 having a toroidal core (not shown in the drawings). The toroidal core is a doughnut-shaped core in which a ferromagnetic material having a rectangular belt shape in a longitudinal section is formed in an annular shape with a starting end and a terminal end coincident with each other. Examples of the ferromagnetic material include iron, nickel, cobalt, and alloys thereof.

As shown in FIG. 4, the toroidal coil 45 has an annular shape as viewed from above, and FIG. 4 shows one surface having an annular shape (for example, the upper surface 45a). Here, an annular surface that is a reverse surface of the upper surface 45a (not shown in the drawings) is referred to as the other surface. The current paths 16 and 17 are inserted through the toroidal coil 45. In the second embodiment, the current path 17 does not have the turn current path 170, and instead the current path 17 is inserted from the upper surface 45a toward the other surface in a top view of the toroidal coil 45. The current path 16 is inserted from the other surface toward the upper surface 45a.

The toroidal coil 45 is fixed at a part between the switching elements 131 and 133 of the current path 16 and a part between the switching elements 132 and 134 of the current path 17. A first current ic and a second current id flowing in the same direction are supplied to the current path 16 and the current path 17, respectively.

This configuration allows the first current ic and the second current id flowing in the opposite directions to alternately flow in an annular part of the toroidal coil 45. The induction current generated in the coil section 151 by the first current ic and the second current id is an alternating current. In other words, in the second embodiment, the toroidal coil 45, the current path 17 inserted through the toroidal coil 45 from the upper surface 45a toward the other surface, and the current path 16 inserted from the other surface toward the upper surface 45a functions as a current alternation unit.

In the second embodiment described above, the first current ic and the second current id can be measured by attaching one toroidal coil 45 to the existing current paths. Further, bifilar-winding is possible in the toroidal coil 45 by arranging two conductive wires side by side or twisting the two conductive wires, and winding the twisted conductive wires around the toroidal core. As a result, in the second embodiment, similarly to the first embodiment, the current in the two current paths 16 and 17 can be accurately measured using one toroidal coil 45.

Modifications

Next, a first modification and a second modification of the above first embodiment and second embodiment will be described.

First Modification

In the first modification, the switching elements include the switching elements 132 and 133 that allow the first current ia to flow through the current path 16 and the switching elements 131 and 134 that allow the second current ib to flow through the current path 17. The coil section 151 generates an electromotive force by a current flowing upstream or downstream of the switching elements 132 and 133 and the switching elements 131 and 134. Specifically, in the first modification, the current transformer 15 does not necessarily measure the current between the switching element 132 and the switching element 133 or between the switching element 131 and the switching element 134. The current is measured at any location in the current paths 16 and 17.

Figure 5A:
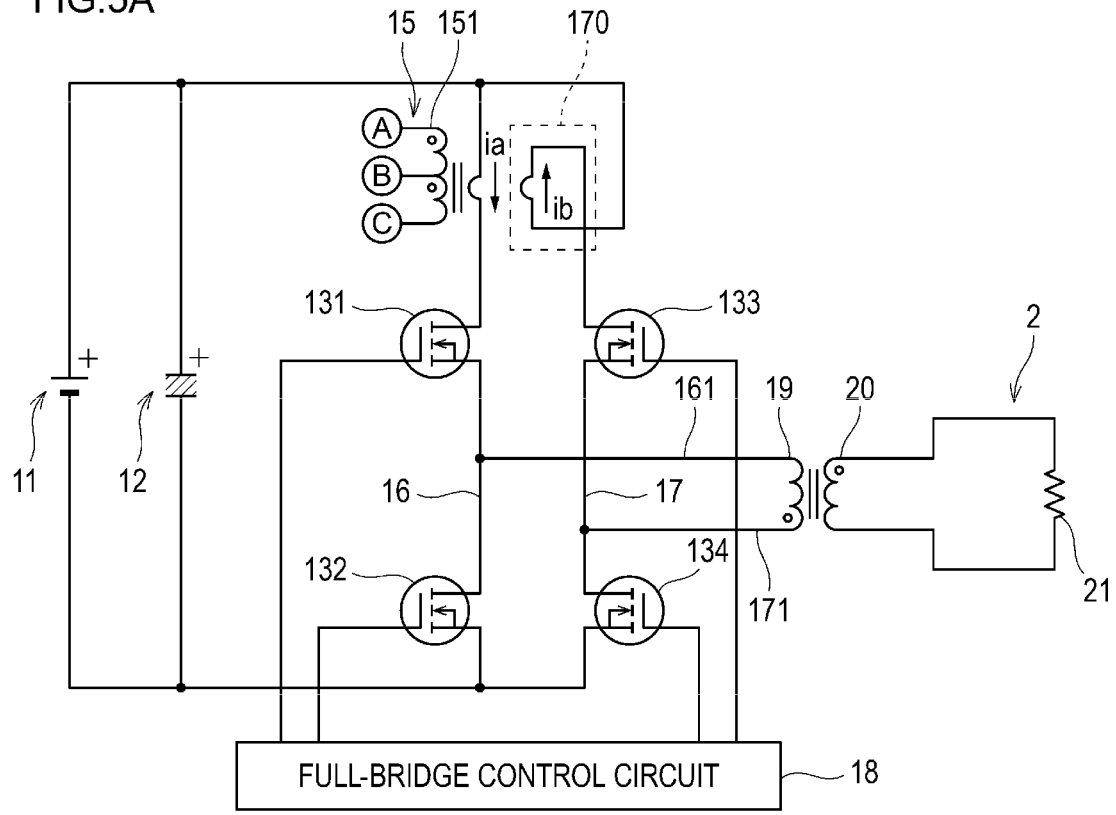
FIG. 5A is a diagram for explaining a first modification of the first embodiment.

FIG. 5A illustrates an example in which the coil section 151 generates an induction current by a current upstream of the switching elements 132 and 133 and the switching elements 131 and 134 in the current detection device 1 according to the first embodiment. The current transformer 15 shown in FIG. 5A is provided upstream of the switching element 131, and the current path 17 configures the turn current path 170 upstream of the switching element 133.

In the current detection device shown in FIG. 5A, as in the first embodiment, the coil end 161 is connected between the switching element 131 and the switching element 134, and the coil end 171 is connected between the switching element 132 and the switching element 133 to supply current to the coil 19. Further, the full-bridge control circuit 18 alternately turns on and off a pair of the switching elements 131 and 133 and a pair of the switching elements 132 and 134, similarly to the first embodiment.

Figure 5B:
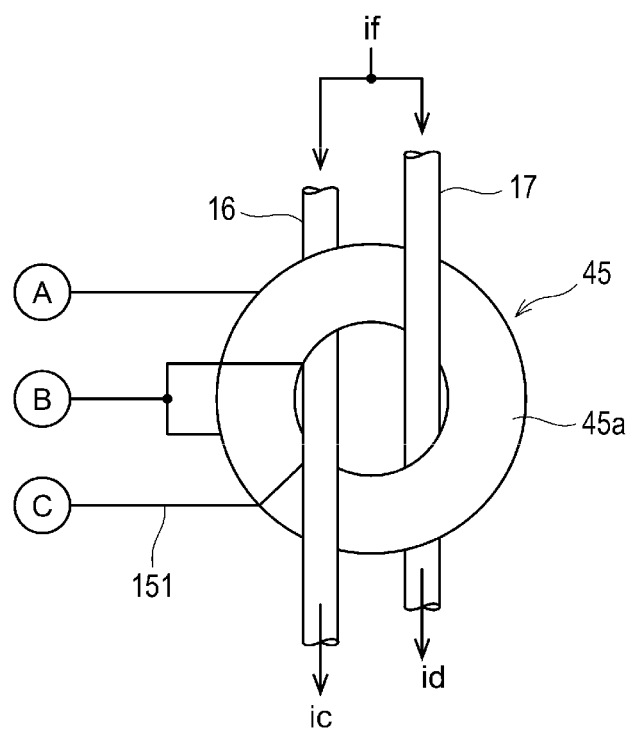
FIG. 5B is a diagram for explaining a first modification of the second embodiment.

FIG. 5B illustrates an example in which the toroidal coil 45 according to the second embodiment is provided upstream of the switching elements 132 and 133 and the switching elements 131 and 134. The toroidal coil 45 and the current paths 16 ad 17 inserted through the toroidal coil 45 shown in FIG. 5B have a similar configuration to a configuration in the second embodiment. However, in the example shown in FIG. 5B, the toroidal coil 45 is provided between the DC power supply 11 and the switching element 131 and between the DC power supply 11 and the switching element 133. Thus, a current if immediately after flowing out of the DC power supply 11 branches into the current paths 16 and 17, and flows in and out as the first current ic and the second current id, respectively.

Figure 6A:
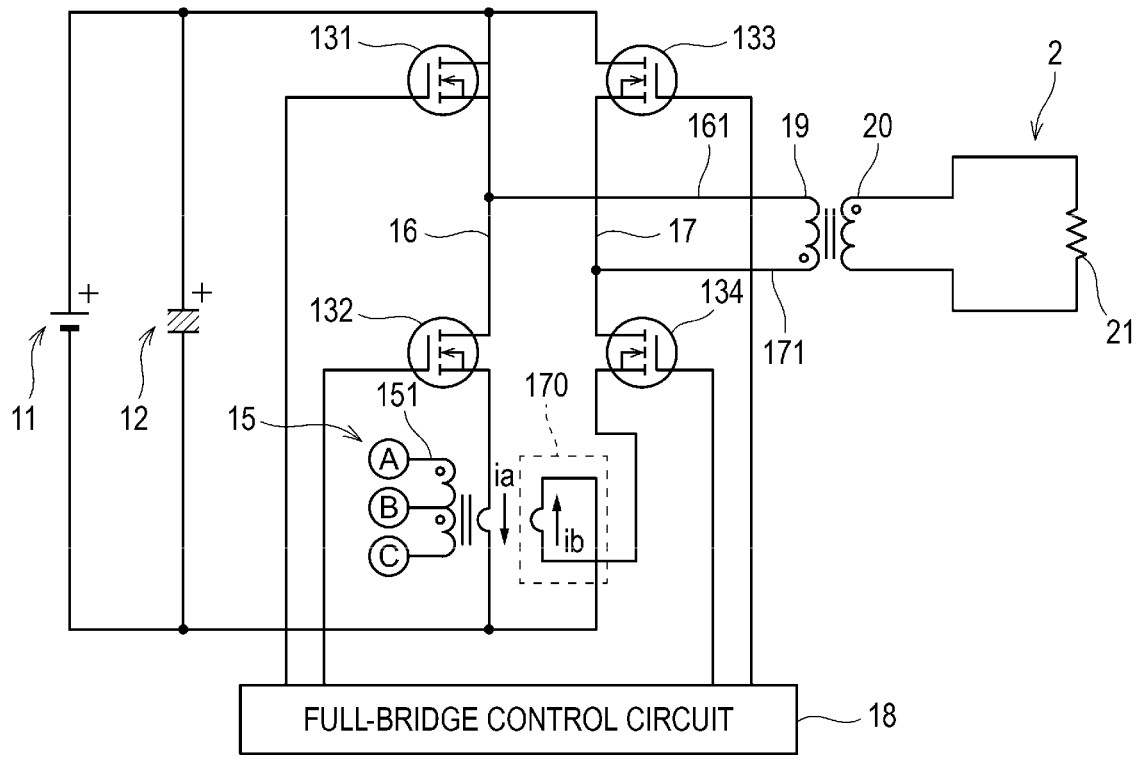
FIG. 6A is another diagram for explaining a first modification of the first embodiment.

FIG. 6A illustrates an example in which the coil section 151 generates an induction current by a current downstream of the switching elements 132 and 133 and the switching elements 131 and 134 in the current detection device 1 according to the first embodiment. The current transformer 15 shown in FIG. 6A is provided downstream of the switching element 132, and the current path 17 configures the turn current path 170 downstream of the switching element 134.

Figure 6B:
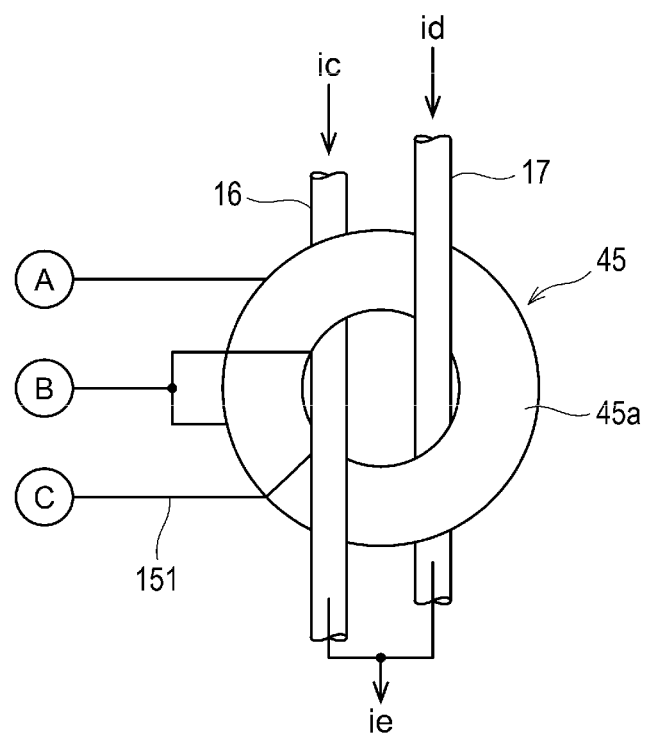
FIG. 6B is another diagram for explaining the first modification of the second embodiment.

FIG. 6B illustrates an example in which the toroidal coil 45 according to the second embodiment is provided downstream of the switching elements 132 and 133 and the switching elements 131 and 134. The toroidal coil 45 and the current paths 16 and 17 inserted through the toroidal coil 45 shown in FIG. 6B have a similar configuration to a configuration in the second embodiment. However, in the example shown in FIG. 6B, the toroidal coil 45 is provided between the switching element 132 and the DC power supply 11 and between the switching element 134 and the DC power supply 11. As a result, the first current ic and the second current id flow into the current paths 16 and 17, merge after flowing out, and flow into the DC power supply 11 as the current ie.

Second Modification

Next, a second modification of the first embodiment will be described.

Figure 7A:
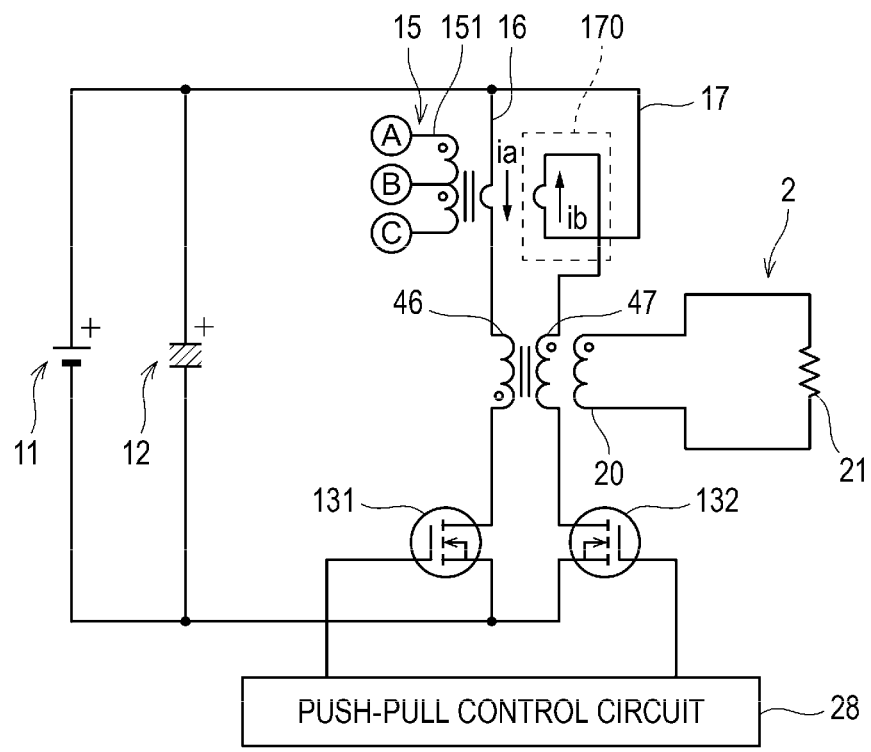
FIG. 7A is a diagram for explaining a second modification of the first embodiment.
Figure 7B:
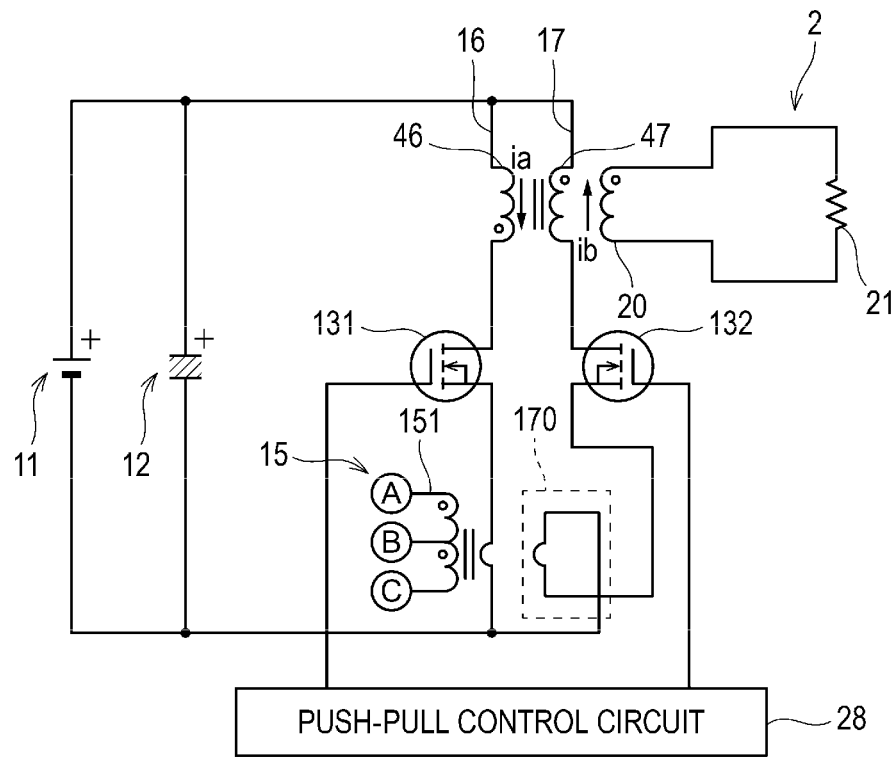
FIG. 7B is another diagram for explaining the second modification of the first embodiment.

FIGS. 7A and 7B are diagrams illustrating a current detection device according to a second modification. In the second modification, the current detection device according to the first embodiment is applied to a push-pull circuit. FIG. 7A illustrates an example in which the current transformer 15 is provided upstream of the switching elements 131 and 132. FIG. 7B illustrates an example in which the current transformer 15 is provided downstream of the switching elements 131 and 132. In the current detection device shown in FIGS. 7A and 7B, a push-pull control circuit 28 alternately turns on and off the switching elements 131 and 132. The DC current supplied from the DC power supply 11 flows alternately into the current path 16 and the current path 17, and the first induction current generated in the coil section 151 is output from the output terminals A and C.

In the current detection device 1 shown in FIGS. 7A and 7B, the coil 46 is connected to the current path 16, and the coil 47 separated from the coil 46 is connected to the current path 17. A current in the same direction as the first current ia is alternately supplied to the coils 46 and 47. By such an operation, currents in different directions alternately flow through the coils 46 and 47, and a current flowing through the coil 20 in the same direction as the coil 47 is generated by electromagnetic induction. The induced electromotive force generated in the coil 20 is supplied to the load 21.

The embodiment includes the following technical idea.

(1) A current detection device comprising:
a first current path through which a first current flows and a second current path through which a second current flows;
a switching element that switches between the first current path and the second current path and allows the first current and the second current to flow alternately;
a common coil section through which an induction current flows by the first current and the second current; and
a current alternation unit that alternates the induction current flowing through the coil section by the first current and the induction current flowing through the coil section by the second current.

(2) The current detection device according to (1),
in which the coil section includes a first coil and a second coil, and
the first coil and the second coil are bifilar-wound around one core.

(3) The current detection device according to (1) or (2),
in which the switching element includes a first transistor pair including two transistor elements that allow the first current to flow through the first current path, and a second transistor pair including two transistor elements that allow the second current to flow through the second current path, and
the coil section generates an induction current by a current flowing between the two transistor elements included in the first transistor pair or between the two transistor elements included in the second transistor pair.

(4) The current detection device according to (1) or (2),
in which the switching element includes a first transistor pair including two transistor elements that allow the first current to flow through the first current path, and a second transistor pair including two transistor elements that allow the second current to flow through the second current path, and
the coil section generates an electromotive force by a current flowing upstream or downstream of the first transistor pair and the second transistor pair.

(5) The current detection device according to any one of (1) to (4),
in which the current alternation unit includes a turn current path through which the second current flows in the second current path in a direction opposite to a flow direction of the first current, and
the coil section generates an induction current by a current flowing through the turn current path.

(6) The current detection device according to any one of (1) to (4),
in which the coil section is wound around a toroidal core and configure a toroidal coil, and
the current alternation unit includes the first current path inserted from one surface through another surface having an annular shape in a top view of the toroidal coil, and the second current path inserted from the other surface toward the one surface.

(7) The current detection device according to any one of (1) to (6),
in which a center tap is drawn from the coil section.

What is claimed is:
1. A current detection device comprising:
a first current path through which a first current flows and a second current path through which a second current flows;
a switching element configured to switch between the first current path and the second current path such that the first current and the second current alternately flow; and a current transformer configured to measure the first current and the second current flowing alternately through the first current path and the second current path, the current transformer including a common coil section, wherein a first induction current is induced at the common coil section by the first current flowing through the first current path, and a second induction current is induced at the common coil section by the second current flowing through the second current path, and a first phase of the first induction current and a second phase of the second induction current are reversed to each other.

2. The current detection device according to claim 1, wherein the common coil section includes a first coil and a second coil, and the first coil and the second coil are bifilar-wound around one core.

3. The current detection device according to claim 1, wherein the switching element includes a first transistor pair including two transistor elements that allow the first current to flow through the first current path, and a second transistor pair including two transistor elements that allow the second current to flow through the second current path, and the first induction current is induced at the common coil section by the first current flowing between the two transistor elements of the first transistor pair, and the second induction current is induced at the common coil section by the second current flowing between the two transistor elements of the second transistor pair.

4. The current detection device according to claim 1, wherein the switching element includes a first transistor pair including two transistor elements that flow the first current through the first current path, and a second transistor pair including two transistor elements that flow the second current through the second current path, and an electromotive force is generated at the common coil section by the first current flowing at an upstream side or a downstream side of the first transistor pair through the first current path or by the second current flowing at an upstream side or a downstream side of the second transistor pair through the second current path.

5. The current detection device according to claim 1, wherein the second current path includes a turn current path through which the second current flows in a direction opposite to a flow direction of the first current, and the second induction current is induced at the common coil section by the second current flowing through the turn current path in the second current path.

6. The current detection device according to claim 5, wherein the common coil section is wound around a toroidal core to form a toroidal coil, the toroidal coil is annular-shaped when viewed along a first direction, and the toroidal coil has first and second annular surfaces that are outwardly opposite to each other along the first direction, and the first current path is inserted into the toroidal coil from the first annular surface toward the second annular surface, and the second current path is inserted into the toroidal coil from the second annular surface toward the first annular surface.

7. The current detection device according to claim 1, wherein the common coil section is wound around a toroidal core to form a toroidal coil, the toroidal coil is annular-shaped when viewed along a first direction, and the toroidal coil has first and second annular surfaces that are outwardly opposite to each other along the first direction, and the first current path is inserted into the toroidal coil from the first annular surface toward the second annular surface, and the second current path is inserted into the toroidal coil from the second annular surface toward the first annular surface.

8. The current detection device according to claim 1, wherein a center tap is drawn from the common coil section.

* * * * *